United States Patent
Park et al.

(10) Patent No.: US 7,998,804 B2
(45) Date of Patent: Aug. 16, 2011

(54) NONVOLATILE MEMORY DEVICE INCLUDING NANO DOT AND METHOD OF FABRICATING THE SAME

(75) Inventors: Sang-Jin Park, Yongin-si (KR);
Myoung-Jae Lee, Suwon-si (KR);
Young-Kwan Cha, Suwon-si (KR);
Sun-Ae Seo, Hwaseong-si (KR);
Kyung-Sang Cho, Gwacheon-si (KR);
Kwang-Soo Seol, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 104 days.

(21) Appl. No.: 12/318,097

(22) Filed: Dec. 22, 2008

(65) Prior Publication Data
US 2009/0117697 A1    May 7, 2009

Related U.S. Application Data

(62) Division of application No. 11/584,543, filed on Oct. 23, 2006, now abandoned.

(30) Foreign Application Priority Data

Oct. 21, 2005    (KR) .................... 10-2005-0099737

(51) Int. Cl.
*H01L 21/8238* (2006.01)
*H01L 21/02* (2006.01)
(52) U.S. Cl. ........ 438/211; 438/237; 438/585; 257/295; 257/314; 257/E21.21; 257/E21.209
(58) Field of Classification Search .................. 438/211, 438/237, 585; 257/295, 314
See application file for complete search history.

(56) References Cited

U.S. PATENT DOCUMENTS

| | | | |
|---|---|---|---|
| 6,159,620 A * | 12/2000 | Heath et al. .................... | 428/615 |
| 7,297,975 B2 | 11/2007 | Ufert ................................ | 257/2 |
| 2003/0235064 A1* | 12/2003 | Batra et al. .................... | 365/100 |
| 2004/0118448 A1* | 6/2004 | Scher et al. .................... | 136/252 |
| 2004/0180491 A1 | 9/2004 | Arai et al. .................... | 438/200 |
| 2005/0045943 A1 | 3/2005 | Lung et al. .................... | 257/325 |
| 2005/0201149 A1* | 9/2005 | Duan et al. ............... | 365/185.03 |
| 2006/0110870 A1* | 5/2006 | Bhattacharyya .............. | 438/197 |
| 2006/0154432 A1* | 7/2006 | Arai et al. .................... | 438/385 |
| 2007/0045692 A1 | 3/2007 | Kim et al. .................... | 257/295 |
| 2007/0051935 A1* | 3/2007 | Lee et al. .......................... | 257/1 |
| 2007/0054502 A1* | 3/2007 | Seol et al. .................... | 438/782 |
| 2007/0221986 A1* | 9/2007 | Kang et al. .................... | 257/316 |

FOREIGN PATENT DOCUMENTS

| | | |
|---|---|---|
| KR | 1999-008697 | 2/1999 |
| WO | WO 2004/027877 A1 | 4/2004 |

OTHER PUBLICATIONS

Chinese Office Action dated Jan. 16, 2009 w/translation.
Korean Office Action dated Nov. 22, 2006.

* cited by examiner

*Primary Examiner* — A. Sefer
(74) *Attorney, Agent, or Firm* — Harness, Dickey & Pierce, P.L.C.

(57) ABSTRACT

A nonvolatile memory device including a nano dot and a method of fabricating the same are provided. The nonvolatile memory device may include a lower electrode, an oxide layer on the lower electrode, a nano dot in the oxide layer and an upper electrode on the oxide layer. In example embodiments, the current paths inside the oxide layer may be unified, thereby stabilizing the reset current.

9 Claims, 6 Drawing Sheets

NONVOLATILE MEMORY DEVICE INCLUDING NANO DOT AND METHOD OF FABRICATING THE SAME

PRIORITY STATEMENT

This application is a divisional application of U.S. application Ser. No. 11/584,543, filed Oct. 23, 2006 now abandoned, the entire contents of which are incorporated herein by reference, which claims the benefit under 35 U.S.C. §119 to Korean Patent Application No. 10-2005-0099737, filed on Oct. 21, 2005, in the Korean Intellectual Property Office, the entire contents of which are incorporated herein by reference.

BACKGROUND

1. Field

Example embodiments relate to a nonvolatile memory device and a method of fabricating the same. Other example embodiments relate to a nonvolatile memory device including an oxide layer having a resistance gradient, which unifies current paths in the oxide layer by forming a nano dot in the oxide layer, and a method of fabricating the same.

2. Description of the Related Art

Research has been conducted to enhance the integration density of semiconductor devices, for example, semiconductor memory devices. As the integration density is enhanced, the memory capacity per unit area of the memory devices may be improved. Research has also been conducted on driving the device at relatively low power and improving the operation speed thereof. A general semiconductor memory apparatus may include many unit memory cells connected by circuits. Semiconductor memory devices may be classified as volatile memory devices and nonvolatile memory devices.

A dynamic random access memory (DRAM) may be a typical volatile semiconductor memory device. In DRAMs, the unit memory cells may include one switch and one capacitor and DRAMs may have relatively high integration density and relatively fast operating speeds. Because DRAM is a volatile memory device, stored data may be lost when the power is turned off.

Flash memory may be an example of a nonvolatile memory device capable of maintaining stored data after the power is turned off. Unlike DRAMs, flash memory may be nonvolatile, but it may have relatively low integration density and relatively slow operating speed, compared to DRAMs. Research is being done with respect to nonvolatile memory devices (e.g., a magnetic random access memory (MRAM), ferro-electric random access memory (FRAM), phase-change random access memory (PRAM) and/or resistive random access memory (RRAM)).

MRAM may store data by a change in magnetization direction in a magnetic tunnel junction, and FRAM may store data by using the polarization characteristic of ferroelectrics. Each may have merits and demerits, but both have been developed for relatively high integration density, relatively high-speed operation, relatively low-power driving and improved data retention.

PRAM may store data by a change in resistance value according to a phase change and may use a chalcogenide resistor. The memory device may be formed by utilizing the higher resistance of an amorphous state compared to a crystalline state. When PRAM is fabricated by using a conventional semiconductor device fabrication process, etching may be difficult and a relatively long fabrication time may be required. The unit cost of a product may increase due to relatively low productivity, thereby decreasing price competitiveness.

Figure 1A:
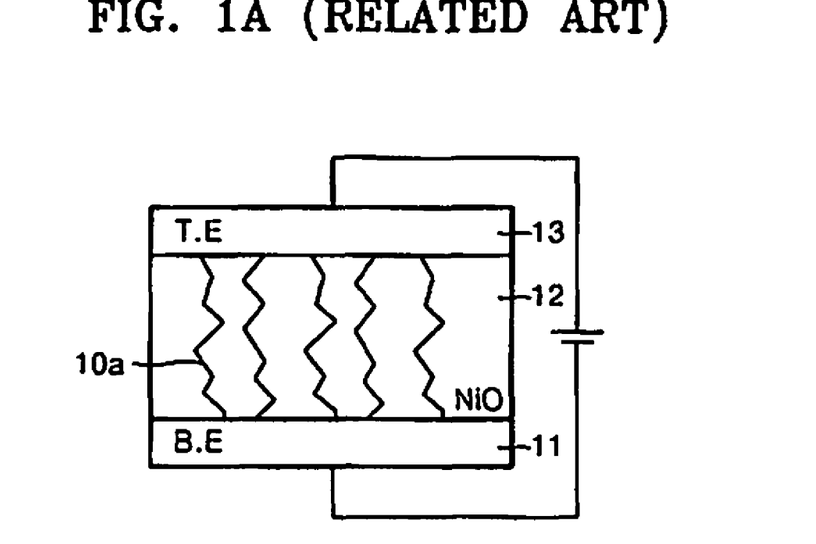
FIGS. 1A and 1B are diagrams illustrating current paths formed in an oxide layer when a voltage is applied to a conventional memory device including the oxide layer formed of a resistance-changing material.
Figure 1B:
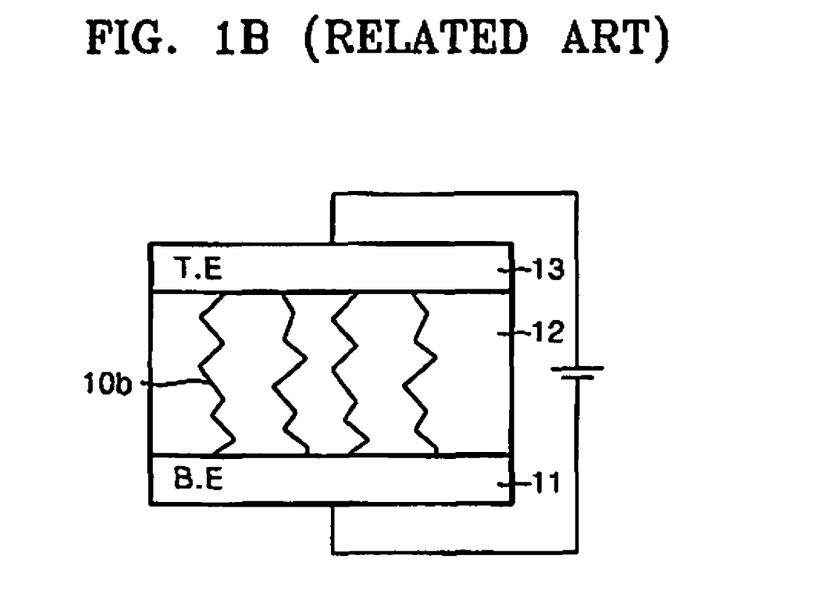

RRAM may use a transition metal oxide as a data-storing layer. RRAM may utilize the resistance-changing characteristic of RRAM in that a resistance value may vary according to an applied voltage. FIGS. 1A and 1B illustrate a conventional structure of a RRAM and current paths formed in an oxide layer by the applied voltage.

In FIGS. 1A and 1B, the RRAM may include an oxide layer 12 and an upper electrode 13 sequentially formed on a lower electrode 11. The lower electrode 11 and the upper electrode 13 may include a metal (e.g., iridium (Ir), ruthenium (Ru), gold (Au), platinum (Pt) and/or an oxide thereof), which is generally used as an electrode of a memory device. The oxide layer 12 may include a transition metal oxide having the resistance-changing (variable resistance) characteristic. The oxide layer 12, as a data-storing layer, may record or reproduce data when the voltage is applied to the oxide layer 12 through the lower and upper electrodes 11 and 13.

When the voltage is applied to the oxide layer 12 through the lower and upper electrodes 11 and 13, a current may flow through the oxide layer 12 due to an electrical potential difference. The current may not flow uniformly in all regions of the oxide layer 12. The flowing current may form momentary current paths 10 in the oxide layer 12 through grain boundaries. As the current paths 10a and 10b formed in the oxide layer 12 are randomly formed, the formation position and number of current paths 10a and 10b may change even if the same voltage is applied to the oxide layer 12 through the lower and upper electrodes 11 and 13. It may be known that the current paths 10a in FIG. 1A and the current paths 10b in FIG. 1B are different from each with respect to their formation position and number.

Figure 2:
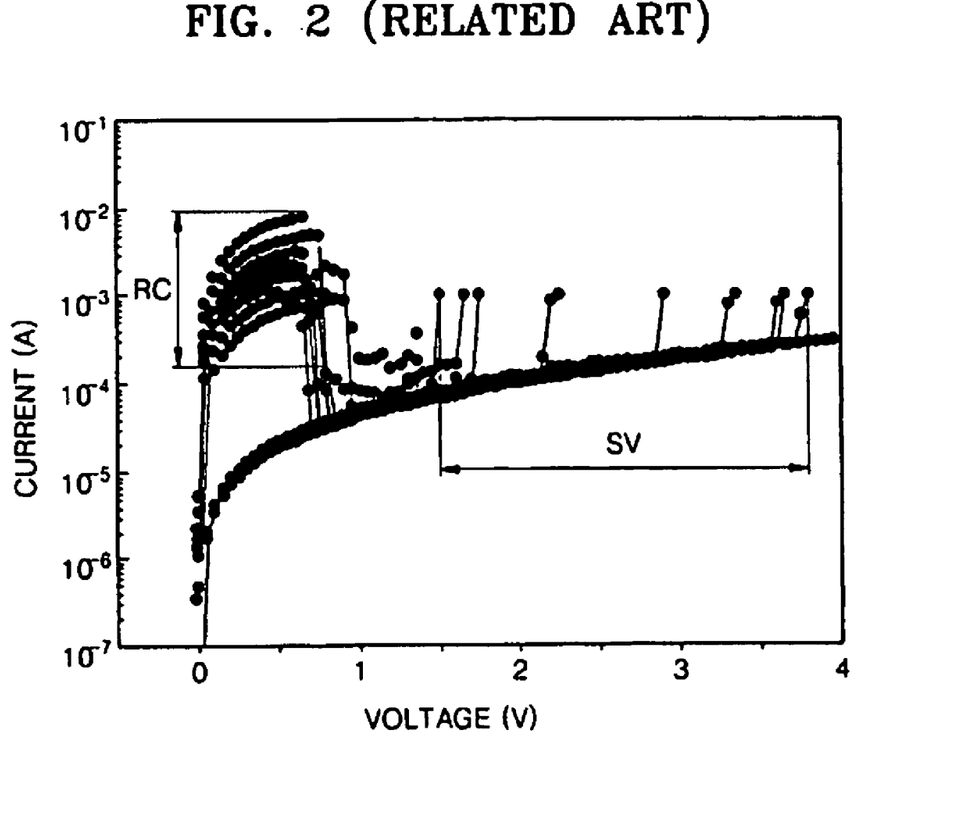
FIG. 2 is a graph comparing a current value to an applied voltage value when the voltage is applied to a conventional memory device including the oxide layer formed of a resistance-changing material.

FIG. 2 is a graph comparing the current value in an applied voltage value when the voltage is applied to a lower electrode and an upper electrode in a memory device, including an oxide layer, formed of a general resistance-changing material. FIG. 2 illustrates the value of current flowing in the oxide layer 12 when a desired voltage is applied to the lower and upper electrodes 11 and 13 of the RRAM of FIGS. 1A and 1B. For example, the oxide layer 12 may include a nickel oxide NiO, and the lower and upper electrodes 11 and 13 may include Pt.

In FIG. 2, the value of current flowing in the oxide layer 12 may be measured while the voltage applied to the lower and upper electrode 11 and 13 gradually increases from about 0V. From the measurement results, it may be noted that the current value to the applied voltage may not be regular and may be different according to the time of measurement. The change in a reset current (RC) may be ten times that of the reset current before the same voltage is applied. The value of a set voltage (SV) may not be maintained. Such unstable results may be the result of the irregular current path distribution in the oxide layer 12. When the RC value is unstable and relatively high, the reliability of the semiconductor memory device may be relatively low and power consumption may increase.

In the conventional memory device of FIGS. 1A and 1B, because the current paths are different whenever the voltage is applied, the current value in the reset state may be irregular.

SUMMARY

Example embodiments provide a nonvolatile memory device having a decreased and stabilized reset current value and a stabilized set voltage, thereby improving the reliability of the memory device, the memory device including an oxide layer formed of a resistance-changing material.

Example embodiments also provide a method of fabricating a nonvolatile memory device to decrease and stabilize a reset current value of the memory device including an oxide layer formed of a resistance-changing material, and to stabilize a set voltage.

According to example embodiments, a nonvolatile memory device may include a lower electrode, an oxide layer on the lower electrode, a nano dot in the oxide layer and an upper electrode on the oxide layer. The oxide layer may include a resistance changing material and a transition metal oxide. The nano dot may unify current paths inside the oxide layer.

The nano dot may include a metal. The oxide layer may include any one material consisting of nickel oxide (NiO), titanium dioxide ($TiO_2$), hafnium oxide (HfO), zirconium oxide (ZrO), zinc oxide (ZnO), tungsten oxide ($WO_3$), cobalt oxide (CoO), and niobium oxide ($Nb_2O_5$). The lower electrode may include a metal (e.g., aluminum (Al), gold (Au), platinum (Pt), ruthenium (Ru), iridium (Ir), titanium (Ti) and/or a metal oxide thereof). The nano dot may be in the middle region of the oxide layer.

According to other example embodiments, a nonvolatile memory device may further include a substrate, a first impurity region and a second impurity region on the substrate, wherein the lower electrode may be electrically connected to the second impurity region, a gate insulating layer and a gate electrode layer on the substrate and contacting the first and second impurity regions. According to other example embodiments, a nonvolatile memory device may further include a metal electrode and a diode structure on the metal electrode, wherein the lower electrode may be formed on the diode structure.

According to other example embodiments, a method of fabricating a nonvolatile memory device including a nano dot may include forming a first oxide layer on a lower electrode, forming a nano dot on a surface of the first oxide layer, forming a second oxide layer on the first oxide layer and the nano dot and forming an upper electrode on the second oxide layer.

The forming of the nano dot on the surface of the first oxide layer may include forming an electrical charging point having a first polarity on the surface of the oxide layer by a focused ion beam and forming a nano dot on the electrical charging point by applying a material having a second polarity opposite to that of the electrical charging point on the surface of the oxide layer.

The method may further include providing a substrate, forming a first impurity region and a second impurity region on the substrate, forming a gate insulating layer and a gate electrode layer on the substrate and contacting the first and second impurity regions, and electrically connecting the lower electrode to the second impurity region. The method may further include providing a metal electrode, forming a diode structure on the metal electrode and forming the lower electrode on the diode structure.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

DETAILED DESCRIPTION OF EXAMPLE EMBODIMENTS

A nonvolatile memory device including a nano dot and a method of fabricating the same will now be described more fully hereinafter with reference to the accompanying drawings, in which example embodiments are shown. In the drawings, the thickness of layers and regions are exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
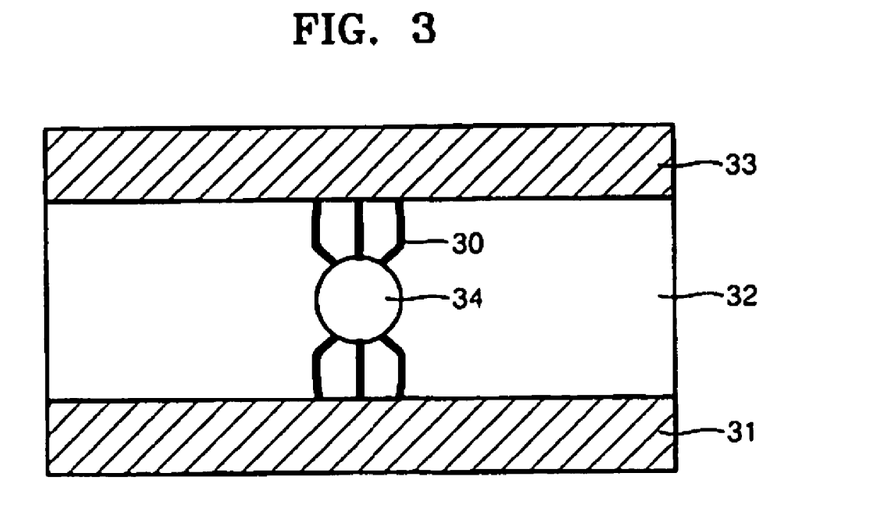
FIG. 3 is a diagram illustrating a structure of a nonvolatile memory device including a nano dot according to example embodiments.

FIG. 3 is a diagram illustrating a structure of a nonvolatile memory device including a nano dot according to example embodiments. In FIG. 3, an oxide layer 32 and an upper electrode 33 may be sequentially formed on a lower electrode 31. The oxide layer 32 may include current paths 30 and a nano dot 34 for controlling the current paths 30. The oxide layer 32 may include a multilayer resistance-changing material where the resistance state varies according to an applied voltage in resistive random access memory (RRAM). For example, the oxide layer 32 may include at least one transition metal oxide (e.g., nickel oxide (NiO), titanium dioxide ($TiO_2$), hafnium oxide (HfO), zirconium oxide (ZrO), zinc oxide (ZnO), tungsten oxide ($WO_3$), cobalt oxide (CoO) and/or niobium oxide ($Nb_2O_5$)). The lower electrode 31 and the upper electrode 33 may include a conductive material used for the electrode of a general semiconductor device. For example, the lower and upper electrodes 31 and 33 may include a conductive material including a metal (e.g., aluminum (Al), gold (Au), platinum (Pt), ruthenium (Ru), iridium (Ir), titanium (Ti) and/or a metal oxide thereof). The nano dot 34 may include a conductive material, for example, a metal, thereby forming a relatively short current path 30 inside the oxide layer 32 when the power is applied through the lower and upper electrodes 31 and 33.

Referring to FIG. 3, when the power is applied to the oxide layer 32 through the lower and upper electrodes 31 and 33, the current paths 30 may not be formed randomly throughout the entire region of the oxide layer 32. In FIG. 3, the current paths 30 may be formed only in the region of the oxide layer 32, where the nano dot 34 is formed. In one semiconductor memory cell, only one nano dot 34 may be formed in the oxide layer 32 to unify the current paths. When a number of nano dots are formed in the oxide layer of one semiconductor memory cell, many current paths may be formed as shown in FIGS. 1A and 1B. The nano dot 34 may include a conductive material, for example, a metal, because it may be formed to control the current paths inside the oxide layer 32. The position where the nano dot 34 is formed may be in the middle region of the inner circumference of the oxide layer 32.

Figure 4A:
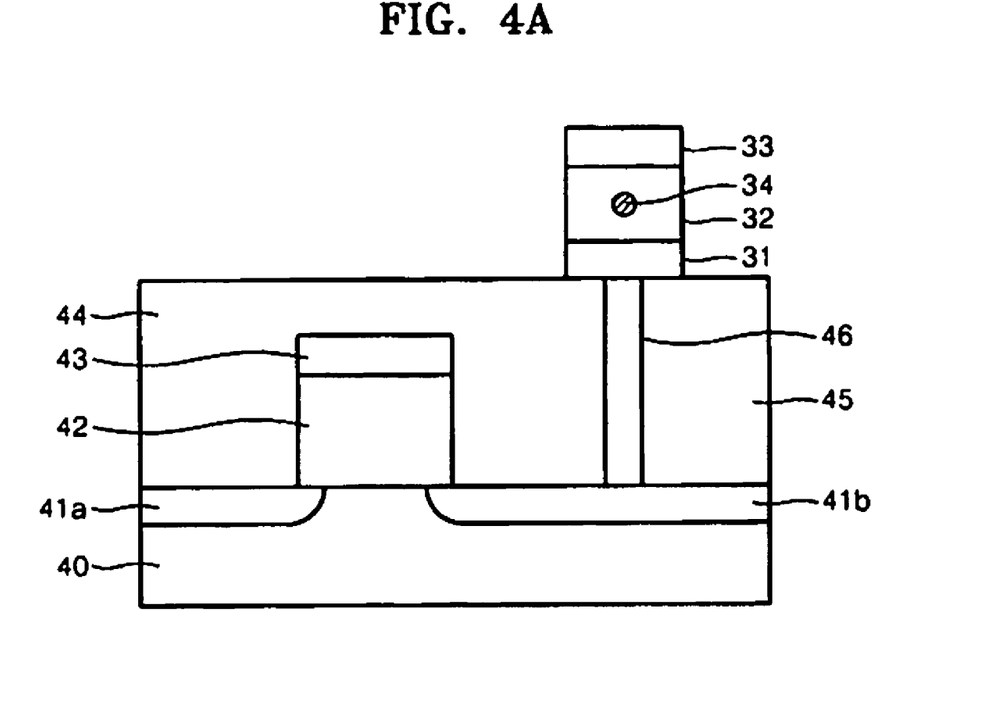
FIG. 4A is a diagram illustrating a transistor structure connected to a nonvolatile memory device including a nano dot according to other example embodiments.
Figure 4B:
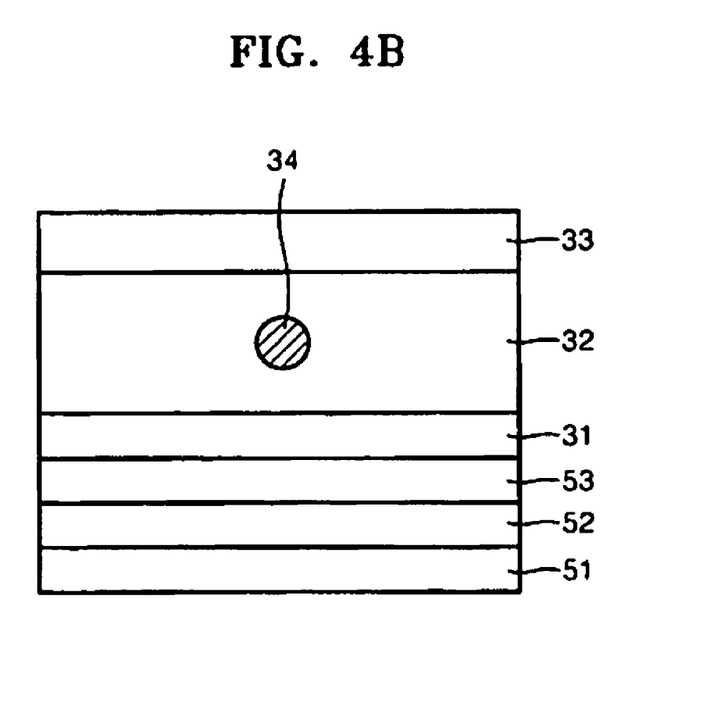
FIG. 4B is a diagram illustrating a diode structure connected to a nonvolatile memory device including a nano dot according to other example embodiments.

FIGS. 4A and 4B are diagrams illustrating a structure in which a switch is connected to the lower electrode or upper electrode of the semiconductor memory device including the nano dot of FIG. 3. The semiconductor memory device including the nano dot according to example embodiments may be formed in the structure of 1 Switch-1 Resistance (1S-1R), wherein S is a transistor (1T-1R) or a diode (1D-1R). FIG. 4A illustrates a transistor structure connected to the semiconductor memory device including the nano dot according to example embodiments, and FIG. 4B illustrates a diode structure connected to the semiconductor memory device according to example embodiments.

In FIG. 4A, a first impurity region 41a and a second impurity region 41b may be formed on a substrate 40. A gate structure, including a gate insulating layer 42 and a gate electrode layer 43, may be formed on the substrate 40 and may contact the first impurity region 41a and the second impurity region 41b. Interlayer insulating layers 44 and 45 may be formed on the surface of the substrate 40, the gate insulating layer 42 and the gate electrode layer 43. A contact plug 46 may penetrate the interlayer insulating layer 45 and may be formed on the second impurity region 41b. The lower electrode 31 of the semiconductor memory device including the nano dot illustrated in FIG. 3 may be electrically connected to the contact plug 46. The above-described transistor structure may be more easily formed using a general fabrication process of a conventional semiconductor memory device. The material, forming a conventional transistor structure, may be used as a material forming each layer. A physical vapor deposition (PVD) process (e.g., sputtering, an atomic layer deposition (ALD) process and/or a chemical vapor deposition (CVD) process) may be used.

In FIG. 4B, a diode structure including, for example, a p-type semiconductor layer 52 and a n-type semiconductor layer 53, may be formed on a metal electrode 51. The lower electrode 31, the oxide layer 32 including the nano dot 34 and the upper electrode 33, as illustrated in FIG. 3, may be formed on the diode structure. The diode structure may include, for example, the p-type semiconductor layer 52 and the n-type semiconductor layer 53 and/or a commonly known diode structure. The metal electrode 51 may be formed of the same material as the lower or upper electrode 31 or 33.

FIGS. 4A and 4B illustrate only the unit cell structure of the semiconductor memory device, but an array form thereof may be possible. For example, the semiconductor memory array connected to the diode structure may be a 1D-1R cross point array which crosses the metal electrode 51 and the upper electrode 33 and may include the oxide layer 32 with the nano dot 35 therebetween.

Figure 5A:
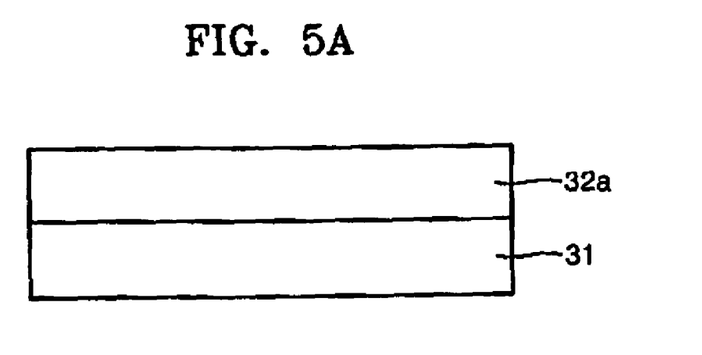
FIGS. 5A-5E are diagrams illustrating a method of fabricating a nonvolatile memory device including a nano dot according to other example embodiments.

A method of fabricating a volatile memory device including a nano dot according to other example embodiments will be described below in reference to FIGS. 5A-5E. In FIG. 5A, a first oxide layer 32a may be formed on a lower electrode 31 by a process (e.g., PVD, ALD and/or CVD). The first oxide layer 32a may include a multilayer resistance-changing material (e.g., NiO, $TiO_2$, HfO, ZrO, ZnO, $WO_3$, CoO and/or $Nb_2O_5$).

Figure 5B:
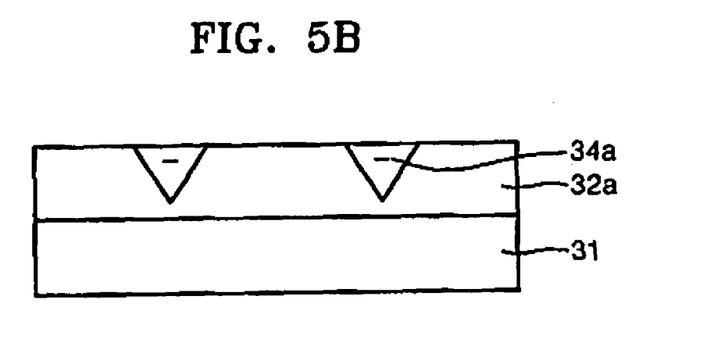

In FIG. 5B, an electrical charging point 34a may be formed at a position designated on the first oxide layer 32a, by electrically charging a desired region of the first oxide layer 32a by means of a focused ion beam (FIB) apparatus. The electrical charging point 34a may be electrically charged with at least any one of positive (+) and negative (−) polarities. When the FIB apparatus is used, the electrical charging point 34a may be formed at a more accurate position on the first oxide layer 32a.

Figure 5C:
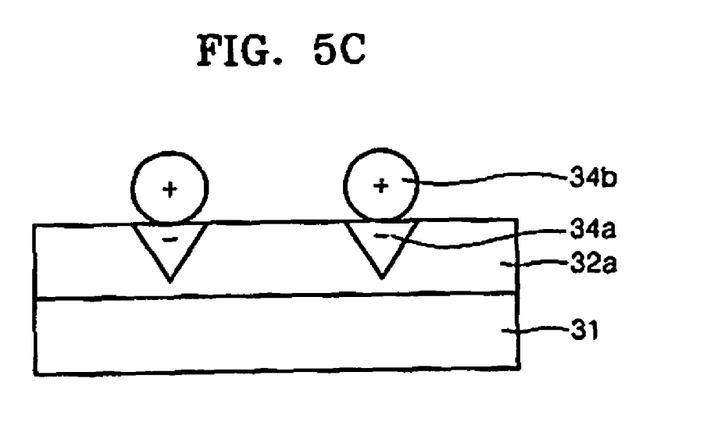
Figure 5D:
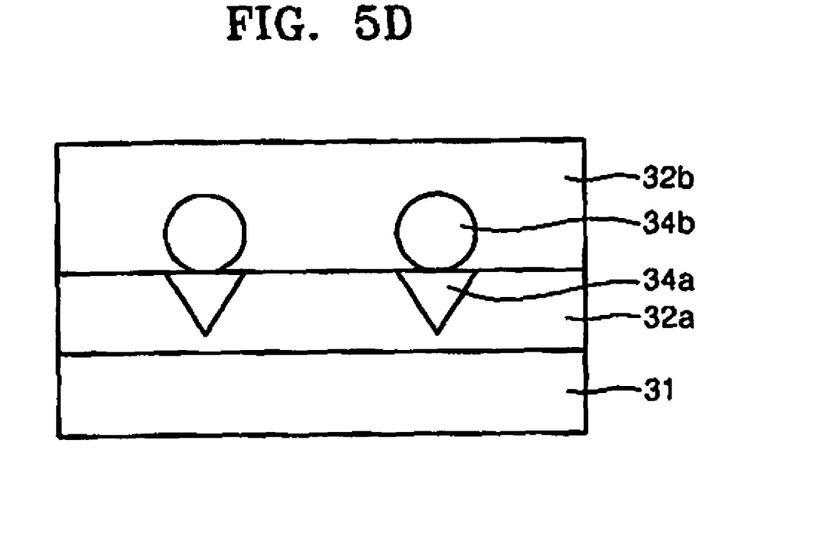
Figure 5E:
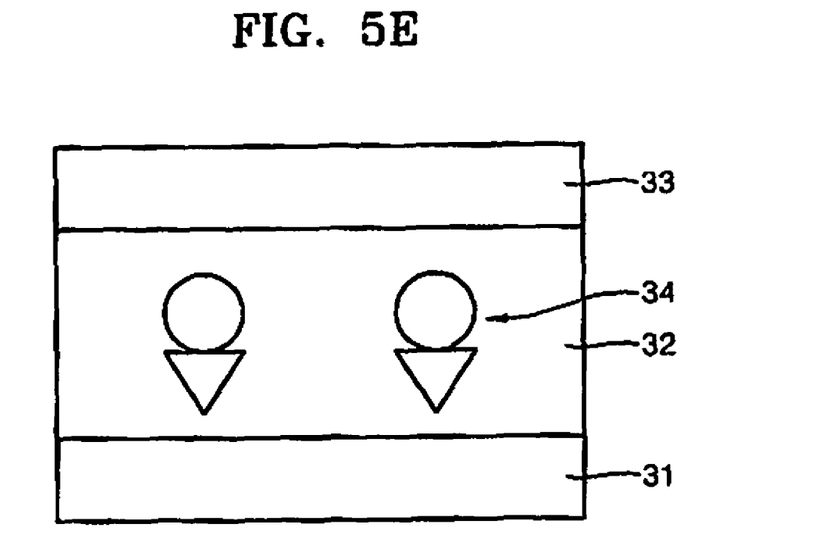

In FIG. 5C, a nano dot 34b may be formed, by performing a vapor deposition method using a charged conductive material, for example, a metal dot, having a second polarity opposite to the polarity of the charged point 34a. In FIG. 5D, a second oxide layer 32b may be formed through a process (e.g., PVD, ALD and/or CVD) after the nano dot 34b is formed. Like the first oxide layer 32a, the second oxide layer 32b may include a multilayer resistance-changing material (e.g., NiO, $TiO_2$, HfO, ZrO, ZnO, $WO_3$, CoO and/or $Nb_2O_5$). In FIG. 5E, an upper electrode 33 may be formed by applying a metal (e.g., Al, Au, Pt, Ru, Ir, Ti and/or a metal oxide thereof) on the second oxide layer 32b.

Figure 6:
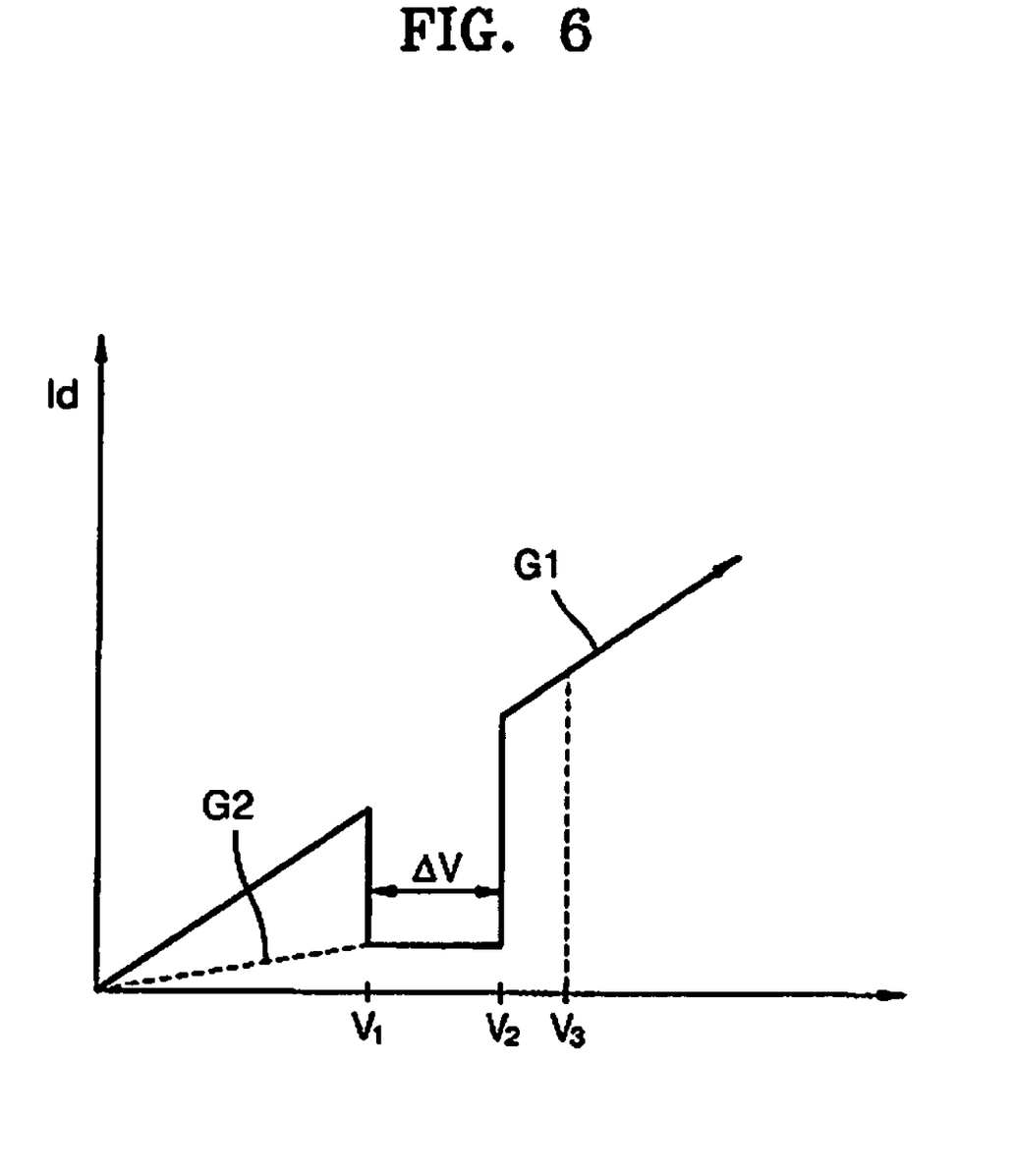
FIG. 6 is a graph illustrating an operation principle of a nonvolatile memory device including a nano dot according to example embodiments.

Below, the operational characteristics of the nonvolatile memory device according to example embodiments will be described in detail, with reference to FIGS. 3 and 6. FIG. 6 is a graph illustrating the electrical characteristic of a memory device including the multilayer resistance-changing material according to example embodiments. In FIG. 6, the horizontal axis represents an applied voltage and the vertical axis represents a current value corresponding to the applied voltage.

Referring to FIG. 6, when a voltage through the lower and upper electrodes 31 and 33 gradually increases from about 0V, the current-value may increase in proportion to the voltage, along the graph $G_1$. When $V_1$ or a greater voltage is applied, the resistance may suddenly increase and the current value may decrease. When a voltage within the range of $V_1$ through $V_2$ is applied, the current value may increase along the graph $G_2$. When $V_2$ ($V_2 > V_1$) or a greater voltage is applied, the resistance may suddenly decrease and the current may again increase, along the graph $G_1$. If the voltage is greater than $V_1$, the electrical characteristic of the memory device may be set according to the extent of the voltage. This electrical characteristic may be confirmed when a voltage less than $V_1$ is applied.

When a voltage in the range of $V_1$-$V_2$ is applied to the memory device and then the voltage less than $V_1$ is again applied, the current value, according to the graph $G_2$, may be measured. When a voltage (for example, $V_3$) greater than $V_2$ is applied to the memory device and then the voltage less than $V_1$ is again applied, a current value, according to the graph $G_1$, may be measured. When using the memory device, the electrical characteristic of the memory device may be designated as "0" when the voltage of $V_1$-$V_2$ is applied, and it may be designated as "1" when a voltage greater than $V_2$ is applied.

In the semiconductor memory device according to example embodiments illustrated in FIG. 3, the nano dot 34 may be formed in the oxide layer 32 so that the current paths inside the oxide layer 32 are unified, thereby maintaining a regular current value in the reset state. Therefore, a reliable memory device may be realized.

A nonvolatile memory device including the nano dot according to example embodiments has been described. The nano dot for unifying the current paths inside the oxide layer of the resistive random access memory (RRAM) may be formed, thereby decreasing and stabilizing the reset current value of the memory device using the resistance-changing material, reducing the power consumption and increasing the reliability of the memory device. The set voltage distribution may be improved and stabilized, thereby increasing the reliability of the memory device in terms of operation control.

While example embodiments have been particularly shown and described with reference to example embodiments thereof, it may be embodied in many different forms and shall not be construed as being limited to the example embodiments set forth herein. The oxide layer may use any materials other than the aforementioned ones if these are resistance-changing materials. Therefore, the spirit and scope of example embodiments shall be defined by the following claims.

What is claimed is:

1. A method of fabricating a nonvolatile memory device including a nano dot, the method comprising:
   forming a first oxide layer on a lower electrode;
   forming a nano dot on a surface of the first oxide layer including,
      forming an electrical charging point having a first polarity on the surface of the first oxide layer, using a focused ion beam, and
      forming a second nano dot on the electrical charging point, by applying a material having a second polarity opposite to that of the electrical charging point on the surface of the first oxide layer;
   forming a second oxide layer on the first oxide layer and the nano dot; and
   forming an upper electrode on the second oxide layer.

2. The method of claim 1, wherein forming the first and second oxide layers includes forming the first and second oxide layers of a resistance changing material.

3. The method of claim 1, wherein forming the first and second oxide layers includes forming a transition metal oxide.

4. The method of claim 1, wherein forming the nano dot includes forming a metal.

5. The method of claim 1, wherein forming the lower electrode includes forming a metal selected from the group including aluminum (Al), gold (Au), platinum (Pt), ruthenium (Ru), iridium (Ir), titanium (Ti) or a metal oxide thereof.

6. The method of claim 1, wherein forming the nano dot includes unifying current paths inside the first oxide layer.

7. The method of claim 1, wherein forming the first oxide layer and the second oxide layer includes forming at least one material consisting of NiO, $TiO_2$, HfO, ZrO, ZnO, $WO_3$, CoO and $Nb_2O_5$.

8. The method of claim 1, further comprising:
   providing a substrate;
   forming a first impurity region and a second impurity region on the substrate;
   forming a gate insulating layer and a gate electrode layer on the substrate and contacting the first and second impurity regions; and
   electrically connecting the lower electrode to the second impurity region.

9. The method of claim 1, further comprising:
   providing a metal electrode;
   forming a diode structure on the metal electrode; and
   forming the lower electrode on the diode structure.

* * * * *